(12) United States Patent
Saito

(10) Patent No.: US 7,772,017 B2
(45) Date of Patent: Aug. 10, 2010

(54) METHOD OF PRODUCING A SOLID STATE IMAGING DEVICE INCLUDING USING A METAL OXIDE ETCHING STOPPER

(75) Inventor: Maki Saito, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 12/179,433

(22) Filed: Jul. 24, 2008

(65) Prior Publication Data

US 2009/0075417 A1    Mar. 19, 2009

Related U.S. Application Data

(62) Division of application No. 11/499,697, filed on Aug. 7, 2006, now Pat. No. 7,420,235.

(30) Foreign Application Priority Data

Aug. 9, 2005    (JP)    ............ P.2005-231010

(51) Int. Cl.
  *H01L 21/66* (2006.01)
  *H01L 21/98* (2006.01)
  *H01L 21/8238* (2006.01)
  *H01L 21/302* (2006.01)
(52) U.S. Cl. ............ 438/24; 438/216; 438/736
(58) Field of Classification Search ............ 438/24, 438/216, 736; 257/E31.016
See application file for complete search history.

(56) References Cited

U.S. PATENT DOCUMENTS

| 5,292,673 | A | 3/1994 | Shinriki et al. |
|---|---|---|---|
| 5,581,099 | A | 12/1996 | Kusaka et al. |
| 6,459,126 | B1 | 10/2002 | Mogami et al. |
| 6,995,349 | B2 | 2/2006 | Suzuki et al. |
| 7,049,643 | B2 | 5/2006 | Kawasaki |
| 7,233,037 | B2 | 6/2007 | Nakahashi et al. |
| 2004/0118993 | A1* | 6/2004 | Suzuki ............ 250/214.1 |
| 2004/0209005 | A1 | 10/2004 | Goto et al. |
| 2004/0222448 | A1 | 11/2004 | Takao |
| 2005/0026345 | A1* | 2/2005 | Adetutu et al. ............ 438/199 |
| 2005/0087820 | A1 | 4/2005 | Bai et al. |
| 2005/0127413 | A1 | 6/2005 | Iwawaki |

(Continued)

FOREIGN PATENT DOCUMENTS

JP    5-129583 A    5/1993

(Continued)

*Primary Examiner*—William M. Brewster
(74) *Attorney, Agent, or Firm*—Birch, Stewart, Kolasch & Birch, LLP (57) ABSTRACT

In the solid-state imaging device of the present invention having a photoelectric conversion section and a charge transfer section equipped with a charge transfer electrode for transferring an electric charge generated in the photoelectric conversion section, the charge transfer electrode has an alternate arrangement of a first layer electrode comprising a first layer electrically conducting film and a second layer electrode comprising a second layer electrically conducting film, which are formed on a gate oxide film comprising a laminate film consisting of a silicon oxide film and a metal oxide thin film, and the first layer electrode and the second layer electrode are separated by insulation with an interelectrode insulating film comprising a sidewall insulating film formed by a CVD process to cover the lateral wall of the first layer electrode.

5 Claims, 5 Drawing Sheets

U.S. PATENT DOCUMENTS

2005/0256291 A1  11/2005  Okamoto et al.
2005/0274996 A1  12/2005  Iwawaki
2005/0277275 A1* 12/2005  Jawarani et al. ............. 438/581
2006/0011952 A1   1/2006  Ohkawa
2006/0199321 A1*  9/2006  Lo et al. .................... 438/197
2006/0261369 A1  11/2006  Maruyama et al.

FOREIGN PATENT DOCUMENTS

JP  2003-197896 A  7/2003
JP  2004-281721 A  10/2004

* cited by examiner

METHOD OF PRODUCING A SOLID STATE IMAGING DEVICE INCLUDING USING A METAL OXIDE ETCHING STOPPER

CROSS REFERENCE

This application is a Divisional of application Ser. No. 11/499,697 filed on Aug. 7, 2006, now U.S. Pat. No. 7,420,235 issued on Sep. 2, 2008, and for which priority is claimed under 35 U.S.C. §120; and this application claims priority of Japanese Patent Application No. 2005-231010 filed in Japan on Aug. 9, 2005 under 35 U.S.C. §119; the entire contents of all are hereby incorporated by reference.

BACKGROUND OF THE INVENTION

1. Field of the Invention

The present invention relates to a solid-state imaging device and a production method thereof, more specifically, the present invention relates to the formation of an interelectrode insulating film of a solid-state imaging device.

2. Background Art

The solid-state imaging device utilizing CCD (Charge-Coupled Device) used for an area sensor and the like has a photoelectric conversion section comprising a photodiode or the like and a charge transfer section equipped with a charge transfer electrode for transferring a signal charge from the photoelectric conversion section. As for the charge transfer electrode, plural charge transfer electrodes are adjacently disposed on a charge transfer path formed on a semiconductor substrate and sequentially driven.

With recent development of CCD having a large number of pixels, demands for high resolution and high sensitivity of a solid-state imaging device are more and more increasing, and the number of imaging pixels has been increased to giga-pixels or more.

Under these circumstances, since reduction of the light-receiving area must be avoided to ensure high sensitivity, it is obliged to reduce the occupation area of the charge transfer electrode.

Incidentally, the interelectrode insulating film provided between charge transfer electrodes can be thinly formed by the oxidation (900 to 950° C.) of an electrode material. However, in order to form a thin and good-quality oxide film, the oxidation temperature needs to be high of 900° C. or more as described above and impurity diffusion on the substrate side proceeds due to heat history by oxidation, incurring various problems such as deterioration of transfer efficiency and reduction of sensitivity.

In this way, the formation of an interelectrode insulating film by using thermal oxidation is a big obstacle standing in the way of developing a fine (high-quality) solid-state imaging device with a large number of pixels.

As described in JP-A-2003-197896 (the term "JP-A" as used herein means an "unexamined published Japanese patent application"), a charge transfer electrode having a multilayer structure where the interelectrode insulting film is formed by a CVD (Chemical Vapor Deposition) process has been proposed with an attempt to reduce the temperature at the formation of the interelectrode insulating film.

In the case of a charge transfer electrode having a single-layer electrode structure, when the formation of an interelectrode gap and the embedding of an insulating film therein are performed by a one-time photolithography process, a fine pattern exceeding the resolution limit can be hardly formed and moreover, the embedding of an insulting film in the interelectrode gap having a high aspect ratio is extremely difficult. By taking account of such situation, there has been proposed a structure where a sidewall is formed as an interelectrode insulating film on the lateral wall of a first layer electrode formed alternately and a second layer electrode is formed through the sidewall (refer to JP-A-5-129583). In such circumstances, for the purpose of high integration, the present inventors have proposed a solid-state imaging device where a sidewall comprising a silicon oxide film formed by a low-temperature CVD process is used for one lateral wall of adjacent charge transfer electrodes (refer to Japanese Patent Application No. 2004-281721).

Such a sidewall structure is an excellent structure requiring no photolithography process and being self-alignedly formable by anisotropic etching. In many cases, the gate oxide film has been conventionally constituted by a three-layer structure comprising a 25 nm-thick silicon oxide film (bottom oxide film), a 50 nm-thick silicon nitride film, and a 10 nm-thick silicon oxide film (top oxide film). At the anisotropic etching, the silicon nitride film of the three-layer structure gate oxide film works as a stopper, and the film loss of the gate oxide film is allowed to occur only in the top oxide film. Accordingly, the anisotropic etching enables efficient formation of a charge transfer electrode with high reliability.

In this way, in the production of a solid-state imaging device, it is demanded to avoid a process at a temperature as high as incurring extension of the diffusion length of an already doped impurity, for ensuring a finer fabrication tolerance, prevent deterioration of the charge transfer efficiency, and realize high-speed driving and high-quality image output. To cope with these requirements, a CVD process, particularly, a CVD process performed at a low temperature of 700 to 850° C., has been introduced.

On the other hand, the structure using an ONO film for the gate oxide film has a problem that an electric charge is readily trapped into the silicon nitride film to cause voltage shift due to depletion particularly in the read-out section to which a high voltage is applied, and a malfunction may occur.

From this reason, the fine fabrication of a solid-state imaging device is associated with a demand for a structure not containing silicon nitride in the gate oxide film, further a structure equipped with a thin gate oxide film having high withstand voltage.

SUMMARY OF THE INVENTION

An object of the invention is to provide a solid-state imaging device free from characteristic deterioration by preventing charge trapping into the gate oxide film and assured of high reliability by using a high-quality interelectrode insulating film which is easily microfabricated.

(1) A solid-state imaging device comprising: a semiconductor substrate; a photoelectric conversion section; a gate oxide film comprising a two-layer film containing a silicon oxide film and a metal oxide thin film; a charge transfer section comprising a charge transfer electrode for transferring an electric charge generated in the photoelectric conversion section, the charge transfer electrode comprising: a first electrode comprising a first conductive film; and a second electrode comprising a second conductive film, the first electrode and the second electrode being disposed on a surface of the semiconductor substrate through the gate oxide film and alternatively arranged; and an interelectrode insulating film comprising a sidewall insulating film covering the lateral wall of the first electrode, the interelectrode insulating film separating and insulating the first electrode from the second electrode.

According to this constitution, the gate oxide film is composed of a two-layer film consisting of a silicon oxide film and a metal oxide thin film, so that the withstand voltage can be elevated and a highly reliable solid-state imaging device can be provided. Furthermore, since a highly reliable structure can be formed even when the gate oxide film does not contain a silicon nitride film, the gate oxide film can be composed of a silicon oxide film and charge trapping thereinto can be prevented.

(2) The solid-state imaging device as described in the item (1), wherein the metal oxide thin film has high dielectric constant.

According to this constitution, the metal oxide thin film is composed of a high dielectric thin film such as aluminum oxide, so that satisfactory etching selectivity can be ensured at the anisotropic etching of the silicon oxide film for forming a sidewall insulating film and a highly reliable electrode structure can be formed without causing film loss of the gate oxide film. Furthermore, even in the case where the metal oxide thin film is caused to remain as it is, this constitutes a part of the gate oxide film below the second layer electrode, so that a thin charge transfer electrode structure with high withstand voltage can be obtained. Here, the metal oxide thin film acts as an etching stopper layer at the etching of silicon oxide.

(3) The solid-state imaging device as described in the item (2), wherein the metal oxide thin film comprises at least one element selected from the group consisting of Al, Ti, Hf, Zr, La and Y.

According to this constitution, even when the metal oxide thin film is caused to remain as the gate oxide film of the second layer electrode, a dense and highly reliable gate oxide film can be obtained. Also, the gate oxide film below the first layer electrode and the gate oxide film below the second layer electrode can have the same composition, and the characteristic properties can be uniformized. Furthermore, by virtue of good etching selectivity to silicon oxide, a dense interelectrode insulating film with high withstand voltage can obtained. In addition, the threshold voltage can be controlled by adjusting the Al concentration in the Hf oxide, and a structure where the dielectric constant is increased by decreasing the Al concentration in the read-out region is also effective.

(4) The solid-state imaging device as described in the item (2), wherein the metal oxide thin film has low dielectric constant.

According to this constitution, the gate oxide film can have a low dielectric constant, and a solid-state imaging device capable of driving at a higher speed can be fabricated.

(5) The solid-state imaging device as described in the item (1), wherein the silicon oxide film comprises a silicon oxide film formed by a chemical vapor deposition method.

(6) The solid-state imaging device as described in the item (1), wherein the silicon oxide film comprises a HTO film.

According to this constitution, the film quality can be enhanced and a highly reliable interelectrode insulating film can be formed. The HTO film can be formed at a low temperature and has a dense and good film quality, so that a high-quality sidewall insulating film can be formed. As for the film-forming conditions of the HTO film, the film is preferably formed at a substrate temperature of 700 to 850° C.

In addition, when the first layer electrically conducting film and the second layer electrically conducting film are composed of a silicon-based electrically conducting film, the single-layer fabrication can be easily attained by CMP or etchback and therefore, the processing is facilitated.

In the case of constructing a two-layer electrode structure, when the first layer electrically conducting film and the second layer electrically conducting film are composed of a polymetal, flattening is possible and the resistance is low, so that both thickness reduction and high-speed driving can be realized and in turn, a high-sensitivity highly reliable solid-state imaging device capable of microfabrication can be obtained.

This constitution is effective particularly in the fabrication of a solid-state imaging device having a microfine structure where the interelectrode distance between the first and second electrodes, that is, the thickness of the interelectrode insulating film, is 0.1 μm or less.

When the interelectrode distance is 0.1 μm or less, pattern formation is difficult, but according to this method, the pattern can be easily formed by a lateral wall leaving technique utilizing CVD or anisotropic etching of an oxide film. Furthermore, by virtue of the two-layer structure, withstand voltage can be ensured despite small film thickness and a fine pattern can be easily formed.

(7) A method for producing a solid-state imaging device, the solid-state imaging device containing: a photoelectric conversion section; and a charge transfer section having a charge transfer electrode for transferring an electric charge generated in the photoelectric conversion section, comprising: sequentially laminating a silicon oxide film and a metal oxide thin film on a semiconductor substrate; forming a first electrode comprising a first conductive film; forming a silicon oxide film on the top of the first electrode; anisotropically etching the silicon oxide film by using the metal oxide thin film as an etching stopper to form a sidewall insulating film on the lateral wall of the first electrode; and forming a second electrode comprising a second conductive film through the sidewall insulating film so as to be insulated and separated from the first electrode.

According to this constitution, the top side of the gate oxide film is composed of a metal oxide thin film and by using this as an etching stopper, a sidewall can be successfully formed, so that unlike silicon nitride, charge trapping can be prevented and a compact and highly reliable solid-state imaging device can be fabricated.

(8) The method for producing a solid-state imaging device as described in the item (7), which comprises: removing the metal oxide thin film on the gate oxide film after the forming of the sidewall insulating film, the first insulating film being exposed from the sidewall insulating film.

According to this constitution, if desired, the gate oxide film in the second layer electrode forming region may be constructed not to contain a metal oxide thin film.

(9) The method for producing a solid-state imaging device as described in the item (8), wherein the second electrode is formed by removing and flattening the second conductive film on the first electrode to separate the second conductive film so that the second electrode can be formed between the first electrodes.

According to this constitution, a single-layer electrode structure can be efficiently obtained.

In method for producing a solid-state imaging device of the present invention, the step of forming a sidewall insulating film comprises a step of forming an HTO film by a CVD process.

According to this constitution, a highly reliable solid-state imaging device can be obtained without passing through a high-temperature process.

(10) The method for producing a solid-state imaging device as described in the item (8), wherein the forming of the first electrode comprises: forming the first conductive film; forming a hard mask comprising an insulting film on the first conductive film; and selectively removing the first conductive film by using the hard mask.

According to this method, a first layer electrode pattern with high precision and high reliability can be formed. Also, this hardmask acts as a removal-suppressing layer (stopper layer) of suppressing the removal of the first layer electrode at the time of flattening the second layer electrically conducting film, so that a flat surface can be efficiently formed without bringing about film loss.

The present invention includes the above-described method for producing a solid-state imaging device, wherein the hardmask is a single-layer film comprising a silicon oxide film, and the second layer electrically conducting film is laminated on the hardmask.

(11) The method for producing a solid-state imaging device as described in the item (10), wherein the hard mask comprises a two-layer film containing the silicon oxide film and a silicon nitride film, and the first insulating film is laminated on the hard mask.

According to this method, the first layer electrically conducting film constituting the first layer electrode can be prevented from contamination at the resist ashing. Furthermore, the hardmask successfully acts as a removal-suppressing layer for the first layer electrode in the patterning process of the second layer electrically conducting film and also successfully acts as a removal-suppressing layer on the first layer electrode at the time of forming a sidewall insulating film by anisotropic etching after the patterning of the first layer electrically conducting film.

In the case of forming a single-layer electrode structure by performing flattening with use of chemical mechanical polishing (CMP) or a resist etchback process after the second layer electrically conducting film is formed, the hard mask successfully acts as a removal-suppressing layer for the first layer electrode.

According to the present invention, the gate oxide film is composed of a two-layer film consisting of a silicon oxide film and a metal oxide thin film, so that even when the gate oxide film does not contain a silicon nitride film, high withstand voltage can be obtained. Furthermore, the metal oxide thin film acts as an etching stopper layer at the formation of a sidewall insulting film, so that a highly reliable solid-state imaging device assured of easy production can be provided.

BRIEF DESCRIPTION OF THE DRAWINGS

The invention disclosed herein will be understood better with reference to the following drawings of which.

DETAILED DESCRIPTION OF THE INVENTION

Exemplary embodiments of the present invention are described below by referring to the drawings.

Embodiment 1

Figure 1:
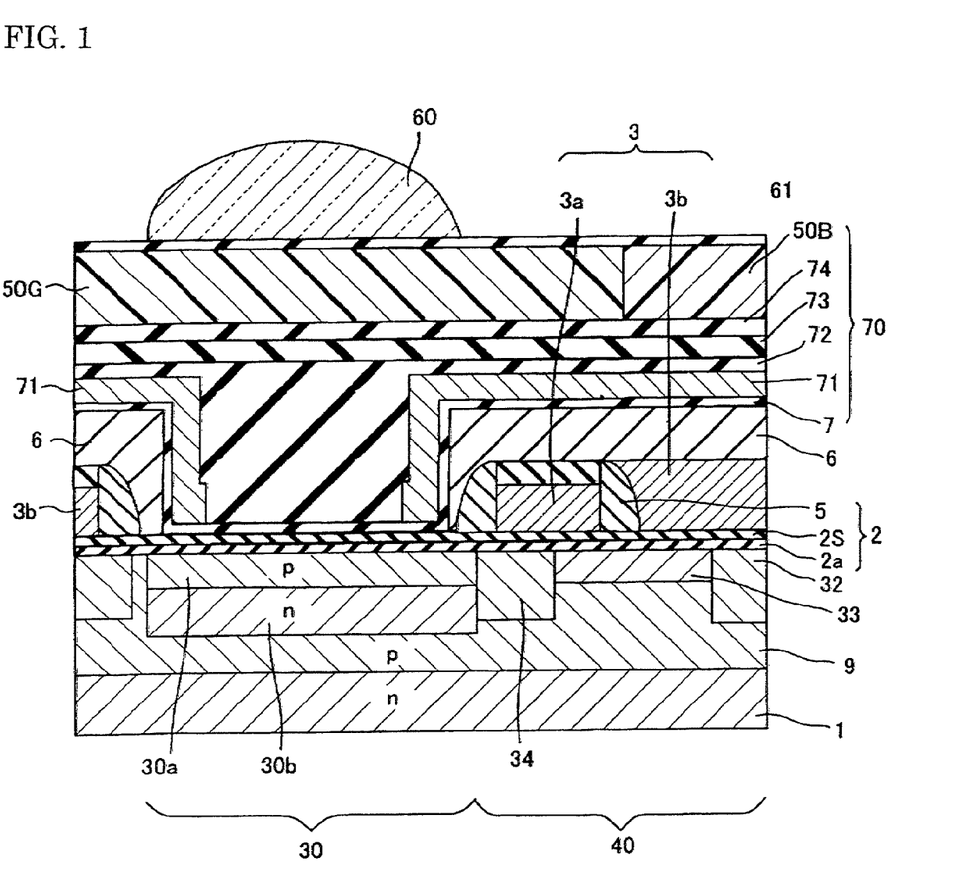
FIG. 1 is a cross-sectional view that illustrates the solid-state imaging device in Embodiment 1 of the present invention.
Figure 2:
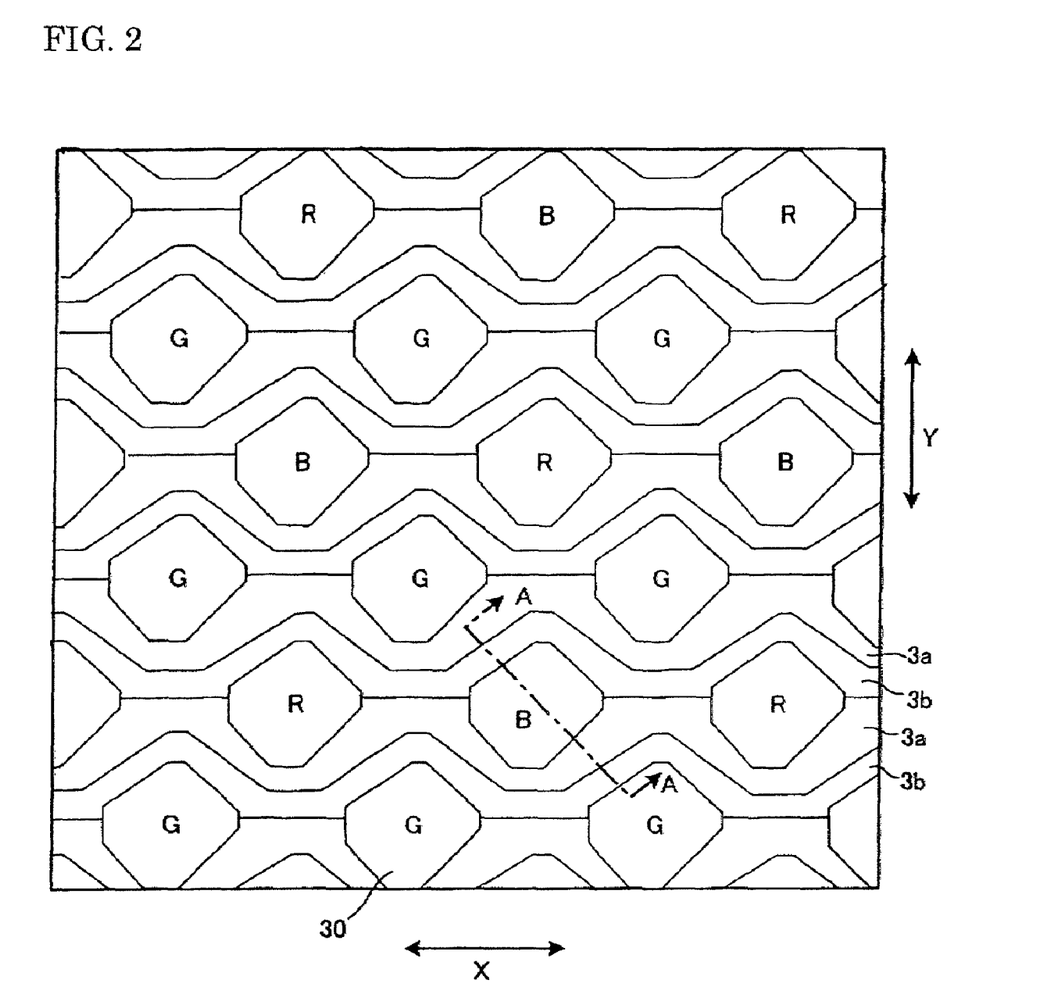
FIG. 2 is a top view that illustrates the solid-state imaging device in Embodiment 1 of the present invention.

This solid-state imaging device is characterized in that, as illustrated in FIGS. 1 and 2, the gate oxide film 2 comprises a two-layer film consisting of a silicon oxide film 2a and a hafnium oxide layer 2S. This hafnium oxide layer 2S has a role of acting as an etching stopper layer in the anisotropic etching process at the formation of a sidewall insulating film and at the same time, preventing charge trapping. Although the solid-state imaging device has the structure of a normal solid-state imaging device except for this, a first layer electrode 3a comprising a polycrystalline silicon layer as the first layer electrically conducting film and a second layer electrode 3b comprising a polycrystalline silicon layer as the second layer electrically conducting film are alternately juxtaposed on the gate oxide film 2, and the interelectrode insulating film is composed of a sidewall insulating film 5 comprising an HTO film (silicon oxide film) formed by a CVD process. The numeral 6 is a silicon oxide film. FIG. 1 is a cross-sectional view, and FIG. 2 is a plan view. FIG. 1 is an A-A cross-sectional view of FIG. 2.

According to this constitution, the gate oxide film is composed of a two-layer film consisting of a silicon oxide film 2a and a hafnium oxide film 2S, so that even at the formation of a sidewall insulating film comprising an HTO film, a high-quality sidewall insulating film with high withstand voltage can be formed at a low temperature without causing film loss of the gate oxide film and the extension of the diffusion length can be prevented. Furthermore, according to this constitution, a first layer electrode 3a and a second layer electrode 3b are alternately juxtaposed, so that a single-layer electrode structure having a flat surface can be easily formed.

Other structures are the same as those of the conventional solid-state imaging device. That is, the solid-state imaging device is characterized by: comprising a photoelectric conversion section 30 and a charge transfer section 40 equipped with a charge transfer electrode for transferring an electric charge generated in the photoelectric conversion section 30; comprising an intermediate layer 70 including, for example, a light-shielding film (not illustrated) formed to have an opening in the photoelectric conversion section and a flattening film comprising a BPSG (borophosphosilicate glass) film filled in the photoelectric conversion section to give a nearly flat surface; and further forming a filter 50 and a lens 60 on the intermediate layer.

By virtue of such a constitution, an interelectrode insulating film can be easily formed without deterioration of the gate oxide film, and good flattening of the surface and great reduction in the thickness can be attained.

On the silicon substrate 1, a plurality of photodiode regions 30 are formed, and a charge transfer section 40 for transferring a signal charge detected in the photodiode region 30 is formed between photodiode regions 30.

The charge transfer channel allowing for travelling of the signal charge transferred by the charge transfer electrode is not illustrated in FIG. 2 but is formed in the direction intersecting with the direction to which the charge transfer section 40 is extending.

As for the interelectrode insulating film, those formed in the vicinity of the boundary between the photodiode region 30 and the charge transfer section 40 are omitted in FIG. 2.

As illustrated in FIG. 1, in the silicon substrate 1, a photodiode 30, a charge transfer channel 33, a channel stop region 32 and a charge read-out region 34 are formed, and on the surface of the silicon substrate 1, a gate oxide film 2 is formed. On the surface of the gate oxide film 2, charge transfer electrodes (a first layer electrode comprising a first layer electrically conducting film 3a and a second layer electrode comprising a second layer electrically conducting film 3b) are formed and juxtaposed with intervention of an interelectrode insulating film 5 comprising a sidewall insulating film formed on the lateral wall of the first layer electrode, whereby a single-layer electrode structure is constructed.

The charge transfer section 40 is as described above, but as illustrated in FIG. 1, an intermediate layer 70 is formed on the top of the charge transfer electrode of the charge transfer section 40. More specifically, an antireflection layer 7 comprising a silicon nitride film is formed, a light-shielding film 71 is provided in the portion excluding the photodiode region 30 (photoelectric conversion section), and a flattening film 72 comprising a BPSG film is formed in the recess part. Furthermore, as upper layers, a passivation film 73 comprising a transparent resin film and a flattening layer 74 under filter are provided.

On the top of the intermediate layer 70, a color filter 50 (50B, 50G) and a microlens 60 are provided. If desired, a flattening layer 61 comprising an insulating transparent resin or the like may be filled between the color filter 50 and the microlens 60.

In this Example, a solid-state imaging device having a so-called honeycomb structure is described, but the same is of course applicable also to a square lattice-type solid-state imaging device.

Figure 3A:
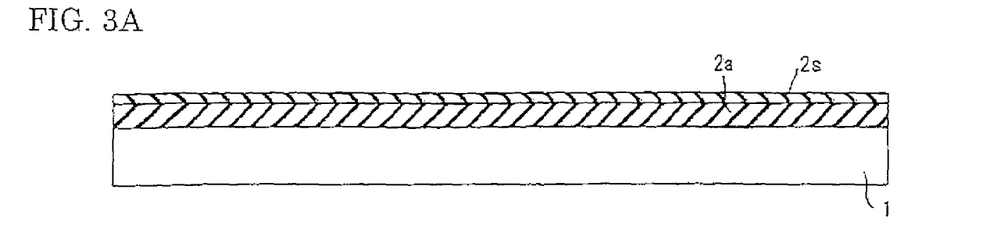
FIG. 3 is a view that illustrates the production process of the solid-state imaging device in Embodiment 1 of the present invention.
Figure 3B:
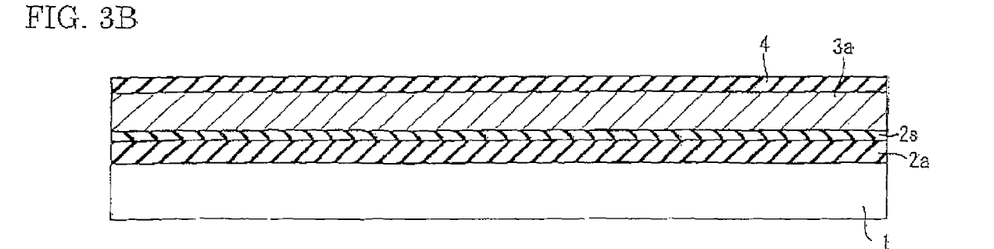

The production process of this solid-state imaging device is described in detail below by referring to FIGS. 3 and 4.

First, a gate oxide film 2 comprising a silicon oxide film having a film thickness of 50 nm and a hafnium oxide layer 2S having a film thickness of 50 nm is formed on the surface of an n-type silicon substrate 1 having an impurity concentration of about $1.0 \times 10^{16}$ cm$^{-3}$.

Subsequently, a first layer polycrystalline silicon film as a first layer electrically conducting film (3a) having a film thickness of 50 to 300 nm is formed on the gate oxide film 2 by a reduced-pressure CVD process. The substrate temperature here is set to 500 to 600° C. On this layer, an HTO film 4 having a film thickness of 50 to 300 nm is sequentially laminated by a CVD process at a substrate temperature of 850° C. (from 700 to 850° C.) (FIG. 3(b)).

Figure 3C:
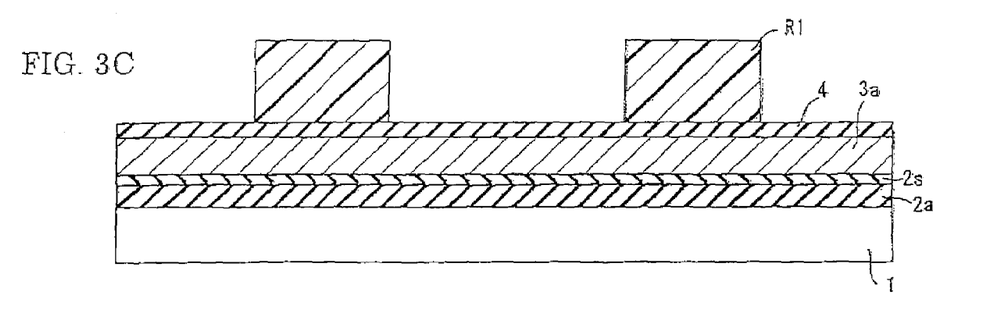

Thereafter, a resist pattern R1 is formed by photolithography (FIG. 3(c)) and through this pattern as the mask, the HTO film 4 is etched by reactive ion etching using $CHF_3$, $C_2F_6$, $O_2$ and He. Then, the resist pattern is removed by ashing to form a hardmask comprising the HTO film 4.

FIGS. 4A-4D illustrate the production process of the solid-state imaging device in Embodiment 1 of the present invention. By using the thus-obtained hardmask comprising the HTO film 4, the first layer electrically conducting film 3a is etched (FIG. 4 (a)). At the etching, reactive ion etching using a mixed gas of HBr and $O_2$ is performed to form a first layer electrode and wiring of peripheral circuits. Here, an etching apparatus such as ECR (electron cyclotron resonance) system or ICP (inductively coupled plasma) system is preferably used.

Figure 4A:
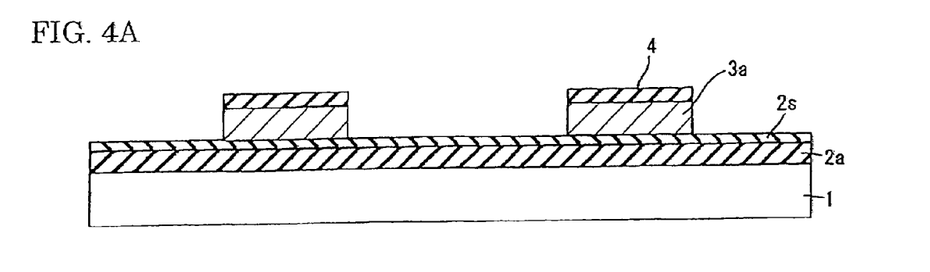
FIG. 4 is a view that illustrates the production process of the solid-state imaging device in Embodiment 1 of the present invention.
Figure 4B:
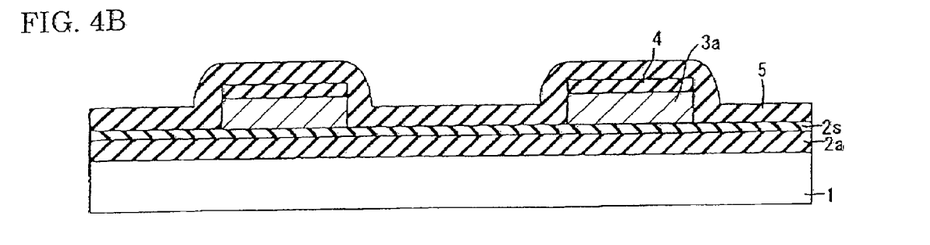

On this layer, an HTO film 5 having a film thickness of 30 to 200 nm is formed by a reduced-pressure CVD process at a high temperature (FIG. 4(b)).

Figure 4C:
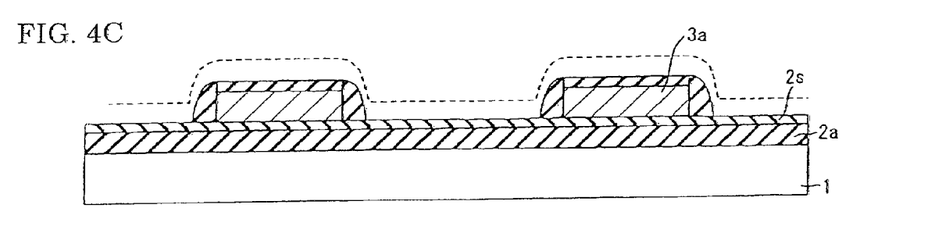
Figure 4D:
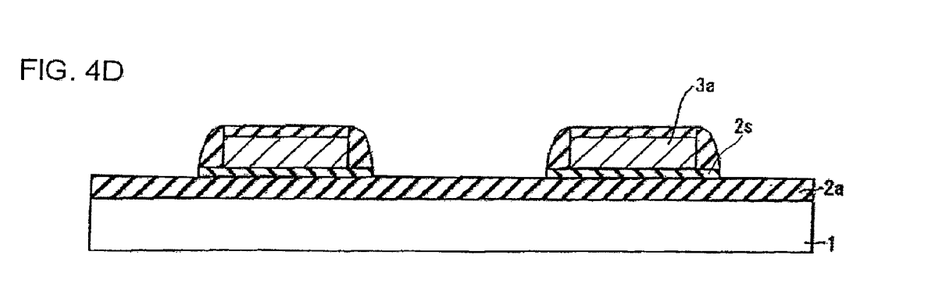

Then, the HTO film 5 accumulated in the horizontal portions is removed by reactive ion etching and allowed to remain on the lateral wall, thereby forming a sidewall (insulating film) (FIG. 4(c)). At this time, the hafnium oxide layer 2S acts as an etching stopper.

Figure 5A:
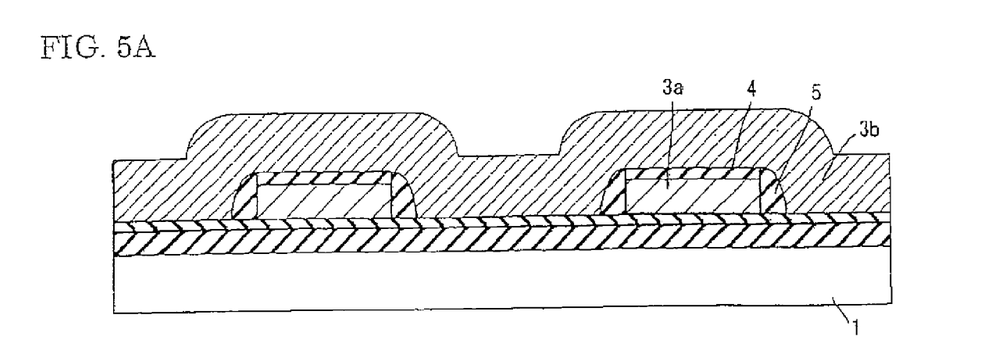
FIG. 5 is a view that illustrates the production process of the solid-state imaging device in Embodiment 1 of the present invention.

Subsequently, a polycrystalline silicon film as the second layer electrically conducting film 3b is formed thereon by a reduced-pressure CVD process to a thickness larger than the height of the first layer electrically conducting film 3a. At this time, the substrate temperature is set to 500 to 600° C. (FIG. 5(a)).

Figure 5B:
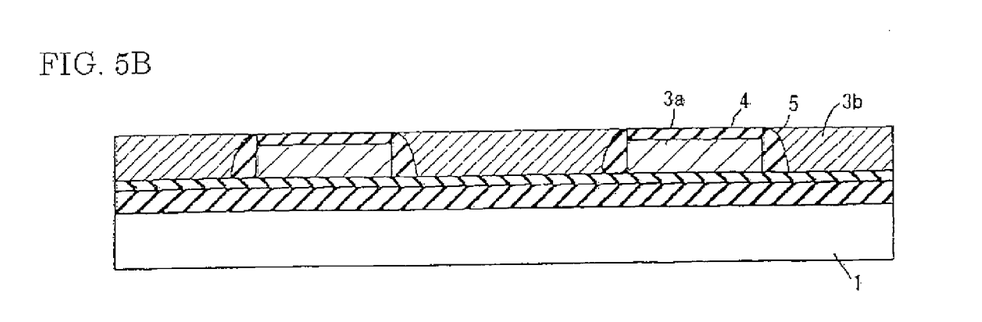

Furthermore, the second layer electrically conducting film 3b in the projected portions is removed by an etchback process to flatten the surface (FIG. 5(b)). In this way, the charge transfer section is formed.

Thereafter, an HTO film 6 having a film thickness up to 50 nm and a silicon nitride film 7 as an antireflection film are formed by a reduced-pressure CVD process (see, FIG. 1).

Subsequently, patterning of the second layer electrode (second layer electrically conducting film) is performed by photolithography, thereby opening a window in the photoelectric conversion section.

After forming an intermediate layer 70 such as antireflection film, light-shielding layer and flattening layer, a color filter 50, a microlens 60 and the like are formed to obtain a solid-state imaging device illustrated in FIGS. 1 and 2.

According to this solid-state imaging device, the gate oxide film is composed of a silicon oxide film 2a and a hafnium oxide layer 2S, and the sidewall can be successfully formed by anisotropic etching using the hafnium oxide layer 2S as an etching stopper, so that a compact and highly reliable solid-state imaging device can be fabricated. Furthermore, the side wall is composed of an HTO film, and a low-resistance single-layer structure electrode is constructed at a low temperature, so that a high-precision fine solid-state imaging device can be fabricated without extension of diffusion length and high-speed driving and microfabrication can be realized According to this method, a fine structure having an interelectrode distance of about 0.1 μm or less can be formed.

Incidentally, the etching stopper layer used at the anisotropic etching for forming the sidewall is the first insulating film 5a and therefore, film loss due to overpolishing of the gate oxide film can be prevented.

Embodiment 2

In Embodiment 1, a laminate film consisting of a silicon oxide film and a hafnium oxide layer is used as the gate oxide film, but in place of the high dielectric thin film such as hafnium oxide layer, a low dielectric thin film having etching resistance may be used at the etching of silicon oxide.

According to this constitution, a thin and highly reliable gate oxide film can be formed because of its high etching selectivity and low dielectric constant, so that finer fabrication can be attained.

Embodiment 3

The patterning of the first layer electrode sometimes brings about film loss of the gate oxide film, but in this Embodiment, the film loss may be supplemented by forming the silicon oxide film by a CVD process.

In the Embodiments above, a charge transfer electrode having a single-layer electrode structure is described, but the same is applicable also to a charge transfer electrode having a two-layer electrode structure.

At this time, a mask needs to be used at the patterning of not only the first layer electrode but also the second layer electrode. In the patterning of these first and second layer electrodes, a two-layer film consisting of a silicon oxide film and a silicon nitride film may be used as the hardmask. By virtue of constructing the hardmask by a two-layer film, not only the pattern precision but also the reliability as an insulating film are enhanced. Moreover, in the flattening step by CMP or resist etchback, where separation of the electrode is also effected, the film acts as a removal-preventing layer (etching stopper) and therefore, the yield can be more enhanced.

The metal constituting the silicide is not limited to tungsten but may be appropriately changed to titanium (Ti), cobalt (Co), nickel (Ni) or the like. Also, the silicon layer is not limited to the polycrystalline silicon but may be appropriately changed to an amorphous silicon layer, a microcrystalline silicon layer or the like.

Furthermore, the production method is not limited to the above-described Embodiments but may be appropriately changed.

As described in the foregoing pages, according to the present invention, the gate oxide film is constituted by a two-layer structure consisting of a silicon oxide film and a metal oxide thin film, so that a highly reliable charge transfer electrode with high withstand voltage can be formed. Also, the interelectrode insulating film can be thinned and therefore, the present invention is effective for the fabrication of a fine and high-sensitivity solid-state imaging device such as compact camera.

The present application claims foreign priority based on Japanese Patent Application (JP2005-231010) filed Aug. 9 of 2005, the contents of which is incorporated herein by reference.

What is claimed is:

1. A method for producing a solid-state imaging device, the solid-state imaging device containing: a photoelectric conversion section; and a charge transfer section having a charge transfer electrode for transferring an electric charge generated in the photoelectric conversion section, comprising in the following order:
   sequentially laminating a silicon oxide film and a metal oxide thin film on a semiconductor substrate;
   forming a first electrode comprising a first conductive film;
   forming a silicon oxide film on the top of the first electrode;
   anisotropically etching the silicon oxide film by using the metal oxide thin film as an etching stopper which is not etched by said anisotropic etching, to form a sidewall insulating film on the lateral wall of the first electrode and to remove said silicon oxide film from the top of the first electrode; and
   forming a second electrode comprising a second conductive film so as to be insulated and separated from the first electrode with intervention of the sidewall insulating film.

2. The method for producing a solid-state imaging device as claimed in claim 1, which comprises:
   removing a part of the metal oxide thin film on which neither the first electrode nor the sidewall insulating film are provided, after the forming of the sidewall insulating film.

3. The method for producing a solid-state imaging device as claimed in claim 2,
   wherein
   the second electrode is formed by removing and flattening the second conductive film on the first electrode to separate the second conductive film so that the second electrode can be formed between the first electrodes.

4. The method for producing a solid-state imaging device as claimed in claim 2,
   wherein
   the forming of the first electrode comprises:
   forming the first conductive film;
   forming a hard mask comprising an insulting film on the first conductive film; and
   selectively removing the first conductive film by using the hard mask.

5. The method for producing a solid-state imaging device as claimed in claim 4,
   wherein
   the hard mask comprises a two-layer film containing the silicon oxide film and a silicon nitride film, and
   the insulating film is laminated on the hard mask.

* * * * *